US009450132B2

(12) United States Patent
Kato et al.

(10) Patent No.: US 9,450,132 B2
(45) Date of Patent: Sep. 20, 2016

(54) PHOTOELECTRIC CONVERSION DEVICE AND MANUFACTURING METHOD THEREOF

(71) Applicant: Semiconductor Energy Laboratory Co., Ltd., Atsugi-shi, Kanagawa-ken (JP)

(72) Inventors: Sho Kato, Kanagawa (JP); Yoshikazu Hiura, Kanagawa (JP); Akihisa Shimomura, Kanagawa (JP); Takashi Ohtsuki, Kanagawa (JP); Satoshi Toriumi, Kanagawa (JP); Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 156 days.

(21) Appl. No.: 14/514,552

(22) Filed: Oct. 15, 2014

(65) Prior Publication Data

US 2015/0053264 A1 Feb. 26, 2015

Related U.S. Application Data

(62) Division of application No. 12/564,991, filed on Sep. 23, 2009, now Pat. No. 8,872,021.

(30) Foreign Application Priority Data

Sep. 24, 2008 (JP) ................................. 2008-243695

(51) Int. Cl.
*H01L 31/077* (2012.01)
*H01L 31/20* (2006.01)
(Continued)

(52) U.S. Cl.
CPC ......... *H01L 31/077* (2013.01); *H01L 21/0237* (2013.01); *H01L 21/0262* (2013.01);
(Continued)

(58) Field of Classification Search
CPC .................. H01L 31/1824; H01L 31/035245
See application file for complete search history.

(56) References Cited

U.S. PATENT DOCUMENTS

| 5,324,364 A | 6/1994 | Matsuda et al. |
| 5,637,156 A | 6/1997 | Kubota et al. |

(Continued)

FOREIGN PATENT DOCUMENTS

| EP | 0566972 A | 10/1993 |
| JP | 06-021494 A | 1/1994 |

(Continued)

OTHER PUBLICATIONS

Vetterl, O. et al, "Intrinsic microcrystalline silicon: A new material for photovoltaics", Solar Energy Materials & Solar Cells, vol. 62 (2000) p. 97-108.*

(Continued)

*Primary Examiner* — Jennifer Michener
*Assistant Examiner* — Christopher Danicic
(74) *Attorney, Agent, or Firm* — Fish & Richardson P.C.

(57) ABSTRACT

An object is to increase conversion efficiency of a photoelectric conversion device without increase in the manufacturing steps. The photoelectric conversion device includes a first semiconductor layer formed using a single crystal semiconductor having one conductivity type which is formed over a supporting substrate, a buffer layer including a single crystal region and an amorphous region, a second semiconductor layer which includes a single crystal region and an amorphous region and is provided over the butler layer, and a third semiconductor layer having a conductivity type opposite to the one conductivity type, which is provided over the second semiconductor layer. A proportion of the single crystal region is higher than that of the amorphous region on the first semiconductor layer side in the second semiconductor layer, and the proportion of the amorphous region is higher than that of the single crystal region on the third semiconductor layer side.

9 Claims, 15 Drawing Sheets

(51) Int. Cl.
*H01L 21/02* (2006.01)
*H01L 31/036* (2006.01)
*H01L 31/0376* (2006.01)
*H01L 31/075* (2012.01)
*H01L 31/18* (2006.01)

(52) U.S. Cl.
CPC ... *H01L21/02532* (2013.01); *H01L 21/02636* (2013.01); *H01L 31/036* (2013.01); *H01L 31/0376* (2013.01); *H01L 31/075* (2013.01); *H01L 31/1804* (2013.01); *H01L 31/20* (2013.01); *Y02E 10/547* (2013.01); *Y02E 10/548* (2013.01); *Y02P 70/521* (2015.11)

(56) References Cited

U.S. PATENT DOCUMENTS

| | | | |
|---|---|---|---|
| 5,677,236 A * | 10/1997 | Saitoh | H01L 31/036 136/249 |
| 5,700,333 A | 12/1997 | Yamazaki et al. | |
| 5,736,431 A | 4/1998 | Shinohara et al. | |
| 5,797,999 A | 8/1998 | Sannomiya et al. | |
| 5,810,945 A * | 9/1998 | Stutzmann | H01L 31/022425 136/255 |
| 6,127,702 A | 10/2000 | Yamazaki et al. | |
| 6,133,119 A | 10/2000 | Yamazaki | |
| 6,268,235 B1 | 7/2001 | Sakakura et al. | |
| 6,271,101 B1 | 8/2001 | Fukunaga | |
| 6,287,888 B1 | 9/2001 | Sakakura et al. | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 2004/0061176 A1 | 4/2004 | Takafuji et al. | |
| 2004/0104424 A1 | 6/2004 | Yamazaki | |
| 2005/0009252 A1 | 1/2005 | Yamazaki et al. | |
| 2006/0121691 A1* | 6/2006 | Noguchi | H01L 21/76254 438/455 |
| 2006/0225775 A1 | 10/2006 | Ishihara | |
| 2007/0108510 A1 | 5/2007 | Fukunaga | |
| 2007/0173000 A1 | 7/2007 | Yamazaki | |
| 2007/0184632 A1 | 8/2007 | Yamazaki et al. | |
| 2007/0291022 A1 | 12/2007 | Yamazaki et al. | |

FOREIGN PATENT DOCUMENTS

| | | |
|---|---|---|
| JP | 09-270525 A | 10/1997 |
| JP | 09-307130 A | 11/1997 |
| JP | 09-312258 A | 12/1997 |
| JP | 10-242493 A | 9/1998 |
| JP | 10-335683 A | 12/1998 |
| JP | 2004-296598 A | 10/2004 |
| JP | 2006-286820 A | 10/2006 |
| WO | WO-2004/086516 | 10/2004 |

OTHER PUBLICATIONS

Vetterl.O et al., "Intrinsic microcrystalline silicon: A new material for photovoltaics", Sol. Energy Mater. Sol. Cells (Solar Energy Materials and Solar Cells), Apr. 15, 2000, vol. 62, No. 1-2, pp. 97-108.

* cited by examiner crystal face (100)

crystal face (110)

crystal face (111)

PHOTOELECTRIC CONVERSION DEVICE AND MANUFACTURING METHOD THEREOF

CROSS-REFERENCE TO RELATED APPLICATIONS

This application is a divisional of U.S. application Ser. No. 12/564,991, filed Sep. 23, 2009, now allowed, which claims the benefit of a foreign priority application tiled in Japan as Serial No. 2008-243695 on Sep. 24, 2008, both of which are incorporated by reference.

BACKGROUND OF THE INVENTION

1. Field of the Invention

An embodiment of the present invention relates to a structure of a photoelectric conversion device utilizing photoelectric effect of a semiconductor and a manufacturing method thereof.

2. Description of the Related Art

A photoelectric conversion device in which a photoelectric conversion cell formed using a single crystal semiconductor and a photoelectric conversion cell formed using an amorphous semiconductor are combined is known. For example, a tandem photoelectric conversion device is disclosed, which is formed as follow: a p-type single crystal silicon layer separated from a p-type single crystal silicon substrate is bonded to a substrate; and an n-type single crystal silicon layer, a p-type amorphous silicon layer, and an n-type amorphous silicon layer are formed in this manner over the p-type single crystal silicon layer (see Patent Document 1).

On the other hand, a single-type photoelectric conversion device is disclosed, which is formed as follow: a microcrystalline silicon layer having sensitivity to a long wavelength and an amorphous silicon layer having sensitivity to a short wavelength are stacked to form an i-type semiconductor layer, and the i-type semiconductor layer is interposed between a p-type semiconductor layer and an n-type semiconductor layer (see Patent Document 2).

The two kinds of photoelectric conversion devices exemplified above have different structures; however, objects of both the structures are to improve conversion efficiency by utilizing characteristics of amorphous silicon whose light absorption coefficient is high in the range of visible light and characteristics of single crystal silicon whose light absorption coefficient is higher in the range of light having long wavelength and whose life time of minority carriers is longer, as compared to amorphous silicon.

REFERENCE

Patent Document

[Patent Document 1] Japanese Published Patent Application No. H10-335683.
[Patent Document 2] Japanese Published Patent Application No. H10-242493.

SUMMARY OF THE INVENTION

However, in the conventional tandem photoelectric conversion device in which a single crystal semiconductor and an amorphous semiconductor are combined, there is a problem in that a top photoelectric conversion cell and a bottom photoelectric conversion cell need to be manufactured independently and therefore, steps are doubled. On the other hand, in the i-type layer in which a microcrystalline silicon layer and an amorphous silicon layer are stacked, a farce number of defects exist in the microcrystalline silicon layer; therefore, conversion efficiency equivalent to that of single crystal silicon in which a small number of defects exist cannot be obtained.

In view of the aforementioned problems, an object is to increase the conversion efficiency of a photoelectric conversion device without increase in the manufacturing steps.

An embodiment of the present invention is a photoelectric conversion device in which a second semiconductor layer including a single crystal region and an amorphous region is provided between a first semiconductor layer having one conductivity type and a third semiconductor layer having a conductivity type opposite to the one conductivity type and characterized by the structure of the second semiconductor layer. That is, the single crystal region and the amorphous region in the second semiconductor layer are formed so that the single crystal region is distributed and occupied dominantly on the first semiconductor layer side and the amorphous region is distributed and occupied dominantly on the third semiconductor layer side. In addition, both of the single crystal region and the amorphous region exist in the center part or at the vicinity of the second semiconductor layer.

According to an embodiment of the present invention, a photoelectric conversion device is described, which includes a first semiconductor layer having one conductivity type, which is single crystal formed over a supporting substrate, a buffer layer including a single crystal region and an amorphous region, a second semiconductor layer provided over the buffer layer, which includes a single crystal region and an amorphous region, and a third semiconductor layer having a conductivity type opposite to the one conductivity type, which is provided aver the second semiconductor layer.

In the second semiconductor layer, the proportion of the single crystal region is higher than that of the amorphous region on the first semiconductor layer side and the proportion of the amorphous region is higher than that of the single crystal region on the third semiconductor layer side. Alternatively, the second semiconductor layer includes the single crystal region which is grown from the buffer layer and includes growing ends each having a needle-like shape, and the amorphous region which is grown toward the third semiconductor layer side so as to have a conical shape whose end is on the buffer layer side and in which the single crystal region is embedded.

Both of the single crystal region and the amorphous region exist in the second semiconductor layer, which generates a synergistic effect, in other words, even when the semiconductor layer is not as thick as a single crystal wafer, the second semiconductor layer functions so that light is absorbed due to existence of the amorphous region to generate photocarriers. When the single crystal region exists in contact with the amorphous region, photocarriers flow through the single crystal region, and therefore, carrier transporting properties of the second semiconductor layer are improved.

According to an embodiment of the present invention, a method for manufacturing a photoelectric conversion device is described, in which a first semiconductor layer having one conductivity type which is a single crystal semiconductor film is formed over a supporting substrate; a buffer layer which includes a single crystal region and an amorphous region is formed over the first semiconductor layer; a second semiconductor layer which includes a single crystal region grown from the single crystal region of the buffer layer, and an amorphous region grown from the amorphous region of the buffer layer, is formed over the buffer layer; and a third semiconductor layer having a conductivity type opposite to the one conductivity is formed over the second semiconductor layer.

The second semiconductor layer includes the single crystal region and the amorphous region which are grown from the butler layer, and is formed so that a larger amount of the single crystal region is included on the first semiconductor layer side than the amorphous region and a larger amount of the amorphous region is included on the third semiconductor layer side than the single crystal region. Alternatively, the second semiconductor layer is formed so as to include the single crystal region which is grown from the buffer layer, and the amorphous region which is grown from the buffer layer so as to have a conical o shape and in which the single crystal region is embedded.

When the first semiconductor layer is formed using a single crystal semiconductor, the buffer layer in which both of the single crystal region and the amorphous region exist can be formed. The buffer layer, in which both of the single crystal region and the amorphous region exist, functions so that the single crystal region and the amorphous region are included in the second semiconductor layer. The buffer layer functions so that the crystal region is unevenly distributed OR the buffer layer side when the second semiconductor layer is formed. The buffer layer functions so that each of the growing ends of the crystal region in the second semiconductor layer has a needle-like shape.

In this specification, "single crystal" refers to a crystal whose crystal planes or crystal axes are aligned with each other and whose atoms or molecules are spatially ordered. Needless to say, although single crystals are structured by orderly aligned atoms, single crystals may include a lattice defect in which part of the alignment is disordered or single crystals may include intended or unintended lattice distortion.

Note that the term "damaged region" in this specification refers to a region at which a single crystal semiconductor substrate is separated into a single crystal semiconductor layer and a separated substrate (a single crystal semiconductor substrate) in a separation step, and refers to the vicinity thereof. The state of the "damaged region" is varied depending on a method for forming the "damaged region". For example, the "damaged region" is a region whose crystal structure is partly disordered and whose crystal is damaged. Note that a region from the surface side of the single crystal semiconductor substrate to the "damaged region" is somewhat damaged depending on a case. However, the "damaged region" in this specification refers to a region at which separation is performed later and refers to the vicinity thereof.

Note that in this specification, the ordinal numbers such as "first", "second", and "third" which are used for predetermined terms are given for convenience in order to distinguish elements does not limit the number and does not limit the arrangement and the order of the steps.

The second semiconductor layer including the single crystal region and the amorphous region is provided between the first semiconductor layer having one conductivity type and the third semiconductor layer having a conductivity type opposite to the one conductivity type, whereby light collection efficiency is improved and conversion efficiency can be increased.

The semiconductor layer including the single crystal region and the amorphous region is formed over the buffer layer including the single crystal region and the amorphous region, so that the photoelectric conversion device which allows the best use of a synergistic effect of a single crystal semiconductor and an amorphous semiconductor can be manufactured without increase of the manufacturing steps.

Figure 1:
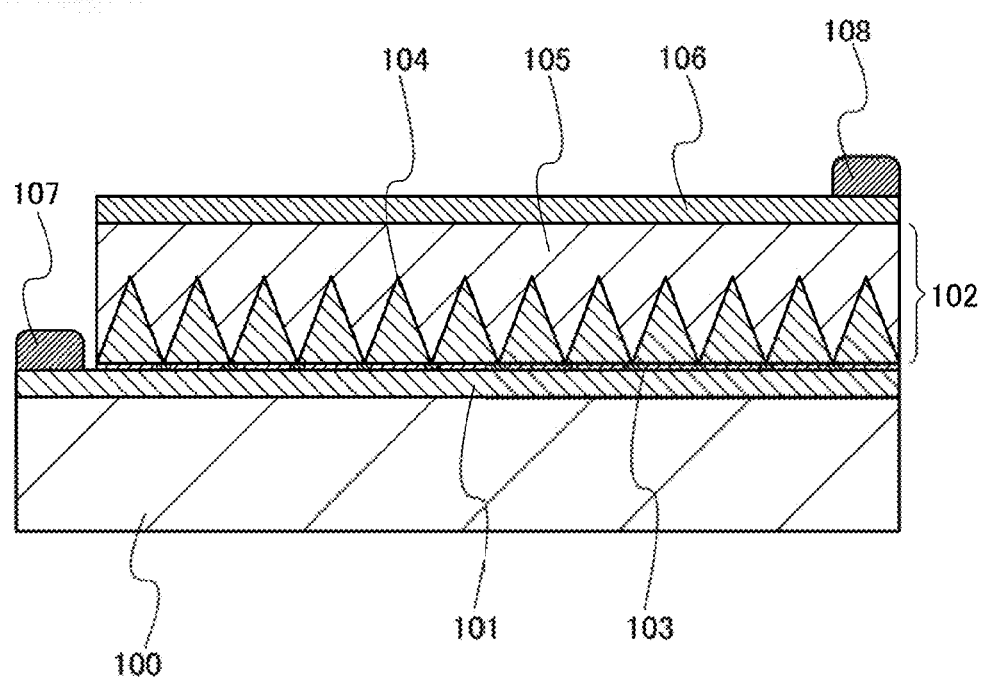
FIG. 1 is a cross-sectional view illustrating a structure of a photoelectric conversion device according to Embodiment 1.

Embodiments and examples of the present invention disclosed are described below with reference to the drawings. However, the present invention is not limited to the following description, and it is easily understood by those skilled in the art that modes and details can be variously changed without departing from the purpose and the scope of the present invention. Therefore, this invention is not interpreted as being limited to the description of the embodiments below.

Further, in embodiments hereinafter described, the same parts are denoted with the same reference numerals throughout the drawings. Note that components illustrated in the drawings, that is, a thickness or a width of a layer, a region, or the like, a relative position, and the like are exaggerated in some cases for clarification in description of embodiments.

EMBODIMENT 1

An embodiment as an example of the present invention is described with reference to FIG. 1. A photoelectric conversion device according to this embodiment includes a semiconductor layer having an effect of photoelectric conversion, a substrate supporting the semiconductor layer, and components attaching thereto.

In FIG. 1, a first semiconductor layer 101 is provided over a substrate 100. As the substrate 100, a glass plate, a quartz plate, a ceramic plate such as an alumina plate, or a metal plate can be used. The first semiconductor layer 101 is preferably formed using a single crystal semiconductor and an impurity imparting one conductivity type of n-type or p-type to a semiconductor is added thereto. This is because the first semiconductor layer 101 is made to be one pole of a photoelectric conversion element.

To form the first semiconductor layer 101 using a single crystal semiconductor, the following method can be applied: a method in which a single crystal semiconductor layer is directly formed over the substrate 100 by a chemical vapor deposition method (CVD); or a method in which a single crystal semiconductor substrate is sliced and fixed to the substrate 100. In the case of the latter method, a hydrogen-implantation-separation method in which hydrogen is implanted into the single crystal semiconductor substrate to form a damaged region and then a surface portion of the single crystal semiconductor substrate is separated can be employed. As the single crystal semiconductor substrate, a single crystal silicon wafer is typically used.

Note that a chemical vapor deposition method is one kind of thin film formation methods and called with this name because chemical reaction is utilized in a film formation process. A chemical vapor deposition method includes a thermal CVD method in which film is deposited by elevating a temperature, a photo CVD method in which irradiation with light is performed in order to promote chemical reaction and thermal decomposition, a plasma CVD method in which a gas is excited so as to be in plasma state, and the like.

The first semiconductor layer 101 sliced by a hydrogen-implantation-separation method is directly bonded to the substrate 100. Directly bonding is a technique by which two objects are brought to be in contact with each other at the atomic level and then bonded together by a bonding force between atoms or molecules. In FIG. 1, the first semiconductor layer 101 and the substrate 100 are directly bonded together; alternatively, another component, for example, an insulating layer such as silicon oxide may be interposed between the first semiconductor layer 101 and the substrate 100. When the substrate 100 and the first semiconductor layer 101 are directly bonded together, adhesive including an organic material which causes contamination of a semiconductor is not needed and separation of the first semiconductor layer 101 from the substrate 100 can be prevented even when heating is performed at a high temperature of 100° C. or higher.

As the method for slicing the single crystal semiconductor substrate, a slicing method in which the single crystal semiconductor substrate is grinded and/or polished may be employed in addition to a hydrogen-implantation-separation method. In this case, the first semiconductor layer 101 is preferably fixed to the substrate 100 by a direct bonding.

A second semiconductor layer 102 provided over the first semiconductor layer 101 includes a single crystal region 104 and an amorphous region 105. Note that a buffer layer 103 including a single crystal region and an amorphous region exists between the first semiconductor layer 101 and the second semiconductor layer 102.

The buffer layer 103 is in contact with the first semiconductor layer 101. Crystals of the buffer layer 103 are grown from the first semiconductor layer 101 by a thin film formation method such as a chemical vapor deposition method, so that the buffer layer 103 includes a single crystal. The buffer layer 103 includes the amorphous region. The density of the amorphous region can be controlled by controlling a temperature at the time of formation of the buffer layer 103. For example, the density of the amorphous region is increased by lowering, the temperature at the time of formation of the buffer layer 103.

The proportion of the amorphous region in the buffer layer 103 including the single crystal region and the amorphous region is preferably less than 10% approximately. This is to increase the proportion of the amorphous region in the second semiconductor layer 102 toward the first semiconductor layer 101 side so as to be higher than the proportion of the single crystal region when the second semiconductor layer 102 is formed.

Alternatively, as the buffer layer 103, a stack obtained in a such a manner that specific treatment is performed on a surface of the first semiconductor layer 101 so that part of single crystal is made amorphous can be used instead of the stack formed over the first semiconductor layer 101 by a thin film formation method as described above. For example, there is a method in which the part of the surface of the first semiconductor layer 101 is made amorphous by plasma treatment. A gas which is not to be deposited such as hydrogen, a rare gas, or a mixed gas of hydrogen and a rare gas, is used in this plasma treatment.

As a means for growing crystals depending on the crystallinity of the first semiconductor layer 101 that is a base, a chemical vapor deposition method (a plasma CVD method) in which glow discharge plasma is used is preferable. The thin film formed as the buffer layer 103 has a single crystal structure in which an amorphous region is mixed due to influence of ion irradiation in the step of crystal growth. For example, if a growing surface of the buffer layer 103 is exposed to plasma in the step of film formation by a plasma CVD method, the crystallinity is partly broken, whereby it is possible that an amorphous region can exist in the single crystal structure.

The layer including the single crystal region 104 and the amorphous region 105 is formed over the buffer layer 103. The single crystal region 104 is grown from the single crystal region of the buffer layer 103. The amorphous region 105 is grown from the amorphous region of the buffer layer 103. The thin film including the single crystal region 104 and the amorphous region 105 can be grown by a chemical vapor deposition method. In a chemical vapor deposition method, the thin film is grown by gas phase reaction of precursors (radicals) in as gas phase and surface reaction of precursors (radicals) at the growing surface. At this time, by controlling the surface reaction, the crystals of the thin film can be grown depending on the crystallinity of the base from which the thin film is grown. Needless to say, in order to grow the thin film including the single crystal region and the amorphous region by controlling the surface reaction, another thin film formation method such as an evaporation method or a sputtering method can be employed.

On the other hand, in the buffer layer 103, when crystals are not grown at the part where the amorphous region exists, an amorphous thin film is grown. As schematically illustrated in FIG. 1, the proportion of the amorphous region 105 is gradually increased with respect to that of the single crystal region 104 as a distance from the buffer layer 103 becomes longer. This is because the growth rate of the amorphous region 105 is higher than that of the single crystal region 104.

The proportion of the single crystal region 104 is reduced as the distance from the buffer layer 103 becomes longer while the amorphous region 105 is grown to have a conical shape. Then, the thickness of the second semiconductor layer 102 is increased, so that the single crystal region 104 is embedded in the amorphous region 105. Therefore, growing ends of the single crystal region 104 each have a needle-like shape.

In this manner, the buffer layer 103 in which both of the single crystal region and the amorphous region exist is provided over the first semiconductor layer 101 having the single crystal phase, and then the thin film is grown thereover, whereby the second semiconductor layer 102 including the single crystal region 104 and the amorphous region 105 can be formed. Note that in the case where a polycrystal is substituted for a single crystal of the single crystal region included in the buffer layer 103, the second semiconductor layer including a polycrystalline region and an amorphous region is formed. When such a semiconductor is used, an object of the present invention can also be achieved and the same effect can also be obtained.

A third semiconductor layer 106 is provided in contact with the second semiconductor layer 102. The third semiconductor layer 106 is a semiconductor layer having a conductivity type opposite to that of the first semiconductor layer 101. Note that the second semiconductor layer 102 is a semiconductor layer to which an impurity imparting a conductivity type is not added purposely. Even when the second semiconductor layer 102 includes an impurity imparting a conductivity type purposely or unintentionally, the impurity is included in the second semiconductor layer 102 at a lower concentration than those of the first semiconductor layer 101 and the third semiconductor layer 106.

The first semiconductor layer 101, the second semiconductor layer 102, and the third semiconductor layer 106 are stacked, so that a diode is formed. A first electrode 107 in contact with the first semiconductor layer 101 and a second electrode 108 in contact with the third semiconductor layer 106 may be provided as appropriate and are accessory elements in the photoelectric conversion device of this embodiment.

In the second semiconductor layer 102, the single crystal region 104 is included at a higher proportion than that of the amorphous region 105 on the first semiconductor layer 101 side; the amorphous region 105 is included at a higher proportion than that of the single crystal region 104 on the third semiconductor layer 106 side. In other words, the second semiconductor layer 102 includes the single crystal region 104 which is grown from the buffer layer 103 and has the growing ends each having a needle-like shape, and the amorphous region 105 which is grown toward the third semiconductor layer 106 so as to have a conical shape whose end is on the buffer layer 103 side and in which the single crystal region 104 is embedded.

The amorphous region 105 has a higher absorption coefficient with respect to light than the single crystal region 104; therefore, light needed for photoelectric conversion can be absorbed even when the thickness of the second semiconductor layer 102 is not thickened to several tens μm. In the presence of the single crystal region 104 in the vicinity of the amorphous region 105, photocarriers generated in the amorphous region 105 flow through the single crystal region 104. Thus, the number of the photocarriers captured by a carrier trap is reduced and a light collection efficiency is increased; therefore, conversion efficiency can be increased. A light collection efficiency is a rate of the maximum number of carriers (the maximum amount of current) which can be extracted from the photoelectric conversion device per unit time with respect to the total number of photons entering the photoelectric conversion device per unit time and per unit area.

The buffer layer 103 has an effect of increasing the proportion of the single crystal region 104 at the beginning of formation of the second semiconductor layer 102 (on the first semiconductor layer 101 side) and increasing the proportion of the amorphous region 105 at the latter half of formation of the second semiconductor layer 102 (on the third semiconductor layer 106 side).

Figure 2A:
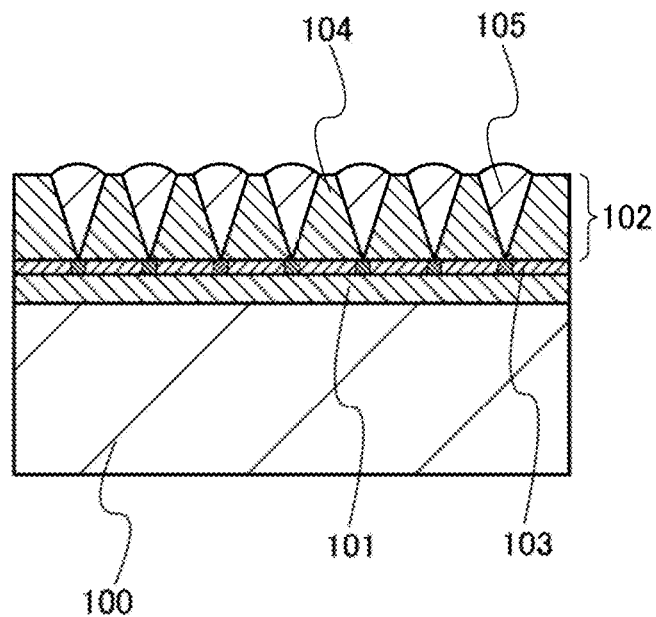
FIGS. 2A and 2B are views schematically illustrating a process through which a single crystal region and an amorphous region are grown from a buffer layer.
Figure 2B:
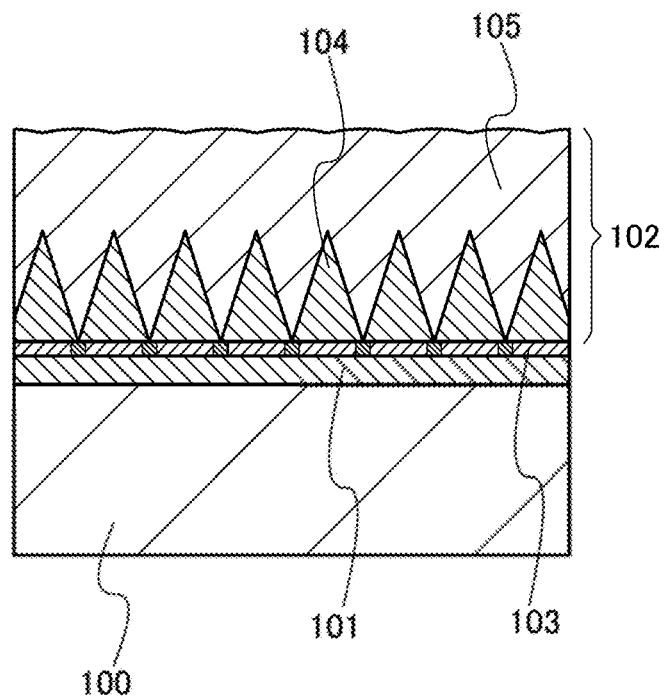

FIGS. 2A and 2B schematically illustrate a process through which the single crystal region 104 and the amorphous region 105 are grown from the buffer layer 103. The buffer layer 103 includes the single crystal region and the amorphous region is included discretely in the single crystal region.

FIG. 2A illustrates a state of the second semiconductor layer 102 in the first half of formation of the second semiconductor layer 102. The single crystal region 104 is grown from the single crystal region of the buffer layer 103 depending on the crystallinity of the single region of the buffer layer 103. On the other hand, the amorphous region 105 is grown from the amorphous region of the buffer layer 103.

Growth of The amorphous region 105 begins from a very minute region and the growing region thereof is spread as the thickness of the second semiconductor layer 102 is increased. This can be explained by a difference between the growth rate of the single crystal region 104 and that of the amorphous region 105. In other words, since the growth rate of the amorphous region 105 is higher than that of the single crystal region 104, the growing region of the amorphous region 105 is spread as the thickness of the second semiconductor layer 102 is increased. As a result, as illustrated in FIG. 2B, the single crystal region 104 is embedded in the amorphous region 105 when the thickness of the second semiconductor layer 102 is increased.

Figure 3A:
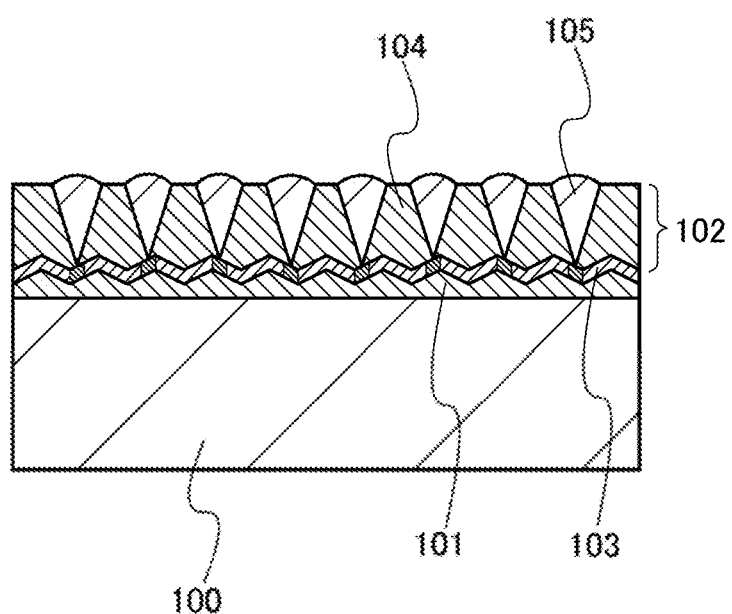
FIGS. 3A and 3B are views schematically illustrating a process through which a single crystal region and an amorphous region are grown from a buffer layer.
Figure 3B:
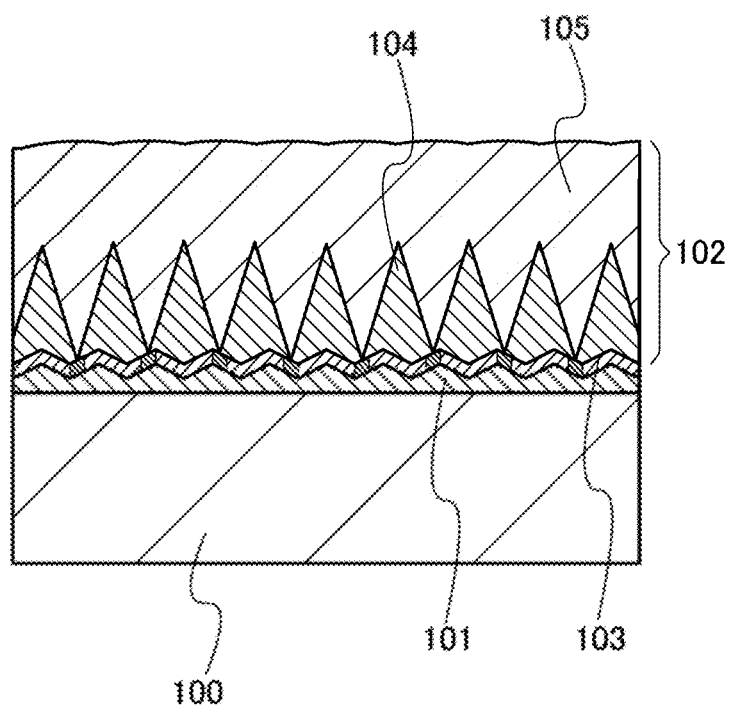

The buffer layer 103 may have a structure in which part of or the entire surface of the first semiconductor layer 101 that is a base is made uneven so that the amorphous region is included in the single crystal region, as illustrated in FIGS. 3A and 3B. Since the base of the butler layer 103 is not flat crystal growth from the first semiconductor layer 101 is partly blocked and the single crystal region and the amorphous region are formed in the buffer layer 103.

Even in the case where the buffer layer 103 formed over the first semiconductor layer 101 that is a base which is not flat is used, the single crystal region 104 and the amorphous region 105 are grown in a similar manner to FIGS. 2A and 2B. The height of the concavity and convexity at the surface of the first semiconductor layer 101 is smaller than the thickness of the second semiconductor layer 102; therefore, the unevenness is embedded in the second semiconductor layer 102.

Note that in the cases of FIGS. 2A and 2B and FIGS. 3A and 3B, since the growth rate of the amorphous region 105 is high, a surface of the second semiconductor layer 102 is not necessarily flat, which is resulted from concurrent growth of the single crystal region 104 with the amorphous region 105.

The second semiconductor layer 102 including the single crystal region 104 and the amorphous region 105 is provided between the first semiconductor layer 101 having one conductivity type and the third semiconductor layer 106 having a conductivity type opposite to the one conductivity type, so that the light collection efficiency is improved and therefore conversion efficiency can be increased. The single crystal region and the amorphous region are included in the buffer layer 103 and the second semiconductor layer 102 is grown thereover by a chemical vapor deposition method, whereby the single crystal region 104 and the amorphous region 105 can be included in the second semiconductor layer 102. Accordingly, the photoelectric conversion device which allows that best use of a synergistic effect of a single crystal semiconductor and an amorphous semiconductor can be obtained without increase of the manufacturing steps.

EMBODIMENT 2

An embodiment as an example of a method for manufacturing a photoelectric conversion device is described with reference to FIGS. 4A to 4C, FIGS. 5A to 5C, and FIGS. 6A and 6B.

Figure 4A:
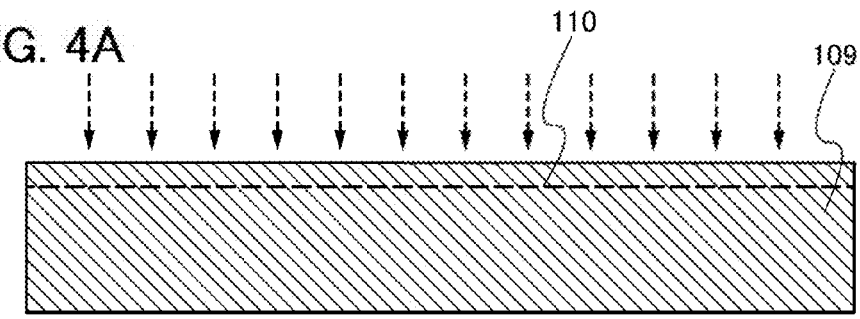
FIGS. 4A to 4C are cross-sectional views illustrating a manufacturing process of a photoelectric conversion device in Embodiment 2.

FIG. 4A illustrates a step in which a semiconductor substrate 109 is irradiated with ions in order to form a first semiconductor layer. Typically, a single crystal silicon wafer is used as the semiconductor substrate 109. As a single crystal silicon wafer, a silicon wafer having, a {100} plane is preferably used. In order to form the first semiconductor layer, a single crystal silicon wafer which is n-type or p-type and has resistivity of 0.005 Ωcm to 0.02 Ωcm is used as the semiconductor substrate 109. This is to obtain the first semiconductor layer having one conductivity type which has a single crystal phase from the semiconductor substrate 109.

A damaged region 110 is formed by irradiating the semiconductor substrate 109 with ions. Ions of a light element such as hydrogen ions or helium ions are preferably used as the ions with which the semiconductor substrate 109 is irradiated. The depth of the damaged region 110 is controlled by a voltage for accelerating the ions. The damaged region 110 is formed at a depth of 50 nm to 150 nm from a surface of the semiconductor substrate 109. Needless to say, provided that the semiconductor substrate 109 is irradiated with one species of ions (for example, hydrogen ions ($H^+$)) accelerated by a predetermined voltage, the element as ions with which irradiation is performed is distributed in the semiconductor substrate 109 so that the distribution is closer to a normal distribution. The depth of the damaged region 110 is generally determined depending on a peak position of the distribution.

Figure 4B:
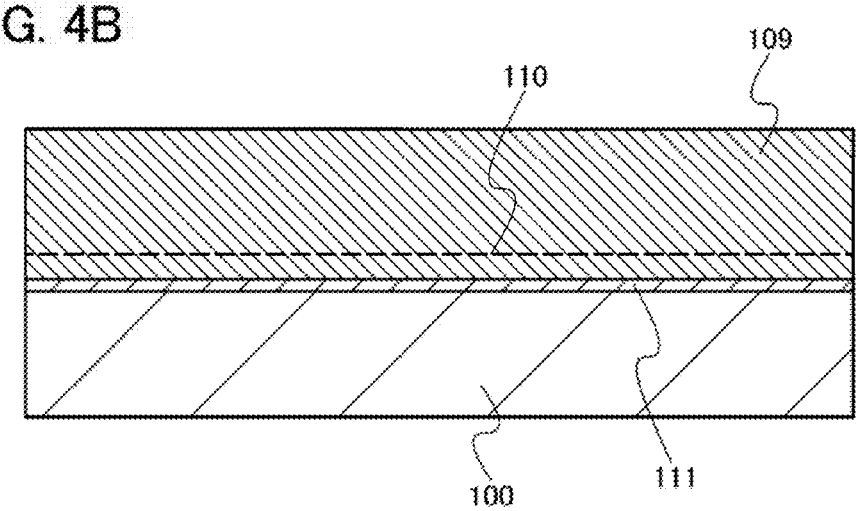

FIG. 4B illustrates a step in which the semiconductor substrate 109 and a substrate 100 are bonded together. The damaged region 110 is formed at a shallow region from the surface of the semiconductor substrate 109 and the surface irradiated with ions is disposed to face the substrate 100 and bonded to the substrate 110. A direct-bonding technique is used for the bonding of the substrate 100 and the semiconductor substrate 109. A direct-bonding technique is a technique by which the same or different kinds of materials are directly bonded together by action of atomic force or intermolecular force. A bonding strength between the semiconductor substrate 109 and the substrate 100 is increased by performing the bonding at a room temperature and heating at a temperature of 100° C. to 300° C.

In addition to the case where the semiconductor substrate 109 and the substrate 100 are directly bonded together, a first insulating layer 111 may be interposed between the semiconductor substrate 109 and the substrate 100 as illustrated in FIG. 4B. In the case of this bonding, the surface of the first insulating layer 111 is made to be hydrophilic surface, a hydroxy group is attached thereto, and then attraction between surfaces acts thereon. This bonding is formed b a hydrogen bond among hydroxy groups of the surface of the substrate which is made to be hydrophilic. When the first insulating layer 111 is formed using silicon oxide or the like, a favorable hydrophilic surface can be obtained. In addition to the silicon oxide, when aluminum oxide, titanium oxide, or the like is used as the first insulating layer 111, whereby a favorable hydrophilic surface can also be obtained.

Figure 4C:
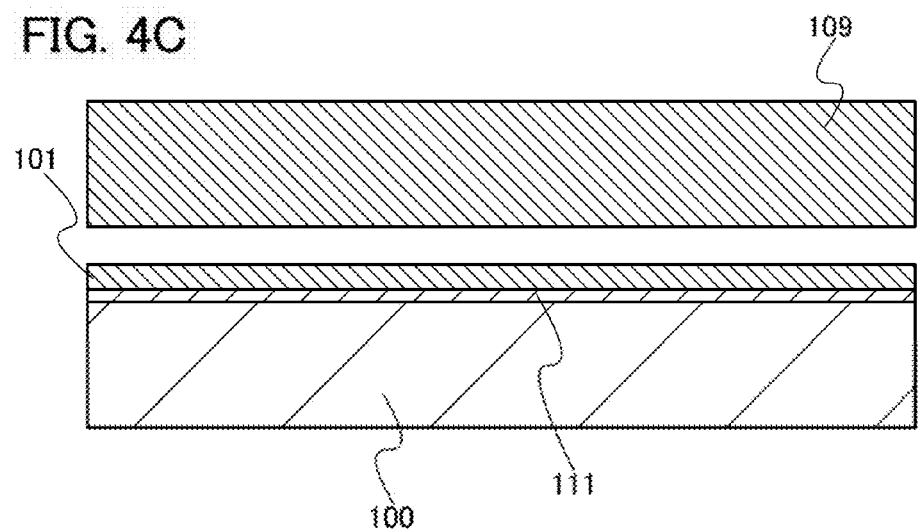

FIG. 4C illustrates a step in which the semiconductor substrate 109 is separated at the damaged region 110 to form a first semiconductor layer 101 over the substrate 100. When the substrate 100 and the semiconductor substrate 109 are bonded together, heat treatment at 400° C. to 700° C. is performed thereon. With this heat treatment, microvoids formed in the damaged region 110 are expanded, so that crack is generated. Then, the semiconductor substrate 109 is separated and the first semiconductor layer 101 is left over the substrate 100.

This heat treatment is also effective for increasing a bonding strength between the substrate 100 and the first semiconductor layer 101 at the same time. The bonding strength by a hydrogen bond is weak; however, hydroxy groups are removed and then a covalent bond is formed, whereby the bonding strength is increased.

Crystal defects are generated in the first semiconductor layer 101 by irradiation with ions and part of the first semiconductor layer 101 is made amorphous. Therefore, treatment for repairing the crystal defects is performed. The treatment may be performed by heat treatment at 600° C. to 1100° C.; alternatively, a method can be employed, in which irradiation with a laser beam is performed to repair the crystal defects and recrystallize an amorphous region.

Figure 5A:
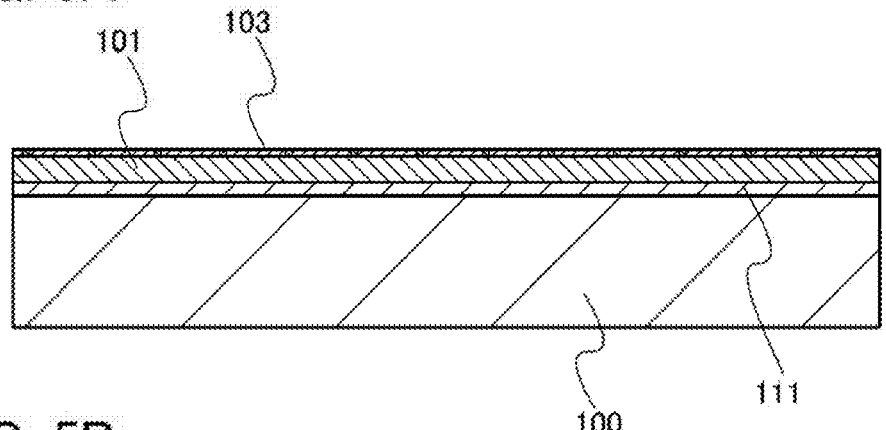
FIGS. 5A to 5C are cross-sectional views illustrating a manufacturing process of a photoelectric conversion device in Embodiment 2.

FIG. 5A illustrates a step in which a buffer layer 103 102 is provided. The buffer layer 103 is formed by stacking a thin film over the first semiconductor layer 101. The buffer layer 103 is formed so as to include a single crystal region and an amorphous region utilizing the crystallinity of the first semiconductor layer 101.

The buffer layer 103 is preferably manufactured by a chemical vapor deposition method. As a chemical vapor deposition method, typically, a chemical vapor deposition method using glow discharge plasma is preferably used. According to a CVD method using glow discharge plasma, control of chemical reaction (control of reaction of gas phase radicals) which is impossible by a thermal chemical reaction can be realized, and therefore, the buffer layer 103 can be formed over the first semiconductor layer 101 even at a low temperature of 350° C. or lower. By generating radicals from a reaction gas by glow discharge plasma and forming the thin film, crystals are grown depending on the crystallinity of the first semiconductor layer 101 that is a base. Accordingly, the buffer layer 103 including the single crystal region and the amorphous crystal region can be formed.

The film formation temperature of the buffer layer 103 is lowered, which facilitates partly inclusion of the amorphous region while crystals are grown from the first semiconductor layer 101. The proportion of the amorphous region in the buffer layer 103 including the single crystal region and the amorphous region is preferably less than 10% approximately.

As the buffer layer 103, a silicon thin film typically having a thickness of 10 nm to 50 nm, preferably is thickness of 20 nm to 30 nm is used. As an example of a method for forming a silicon thin film suitable for the buffer layer 103, the following can be employed: a method in which a silane gas is diluted 50 times to 200 times with hydrogen; a high-frequency electric power in the HF band (3 MHz to 30 MHz) to the VHF band (30 MHz to 300 MHz) is applied; and then a temperature is a room temperature to 300° C.

The buffer layer 103 can be formed by another method in which after a single crystal semiconductor thin film is grown over the first semiconductor layer 101, the single crystal semiconductor thin film is irradiated with ions of hydrogen or an inert gas, and treatment is performed on the single crystal semiconductor thin film so that part thereof is made amorphous. Instead of irradiation with ions, plasma treatment may be performed. Alternatively, the buffer layer 103 can be formed by a sputtering method, a molecule beam epitaxy method that is one of an evaporation method, or the like in addition to a plasma CVD method.

Figure 5B:
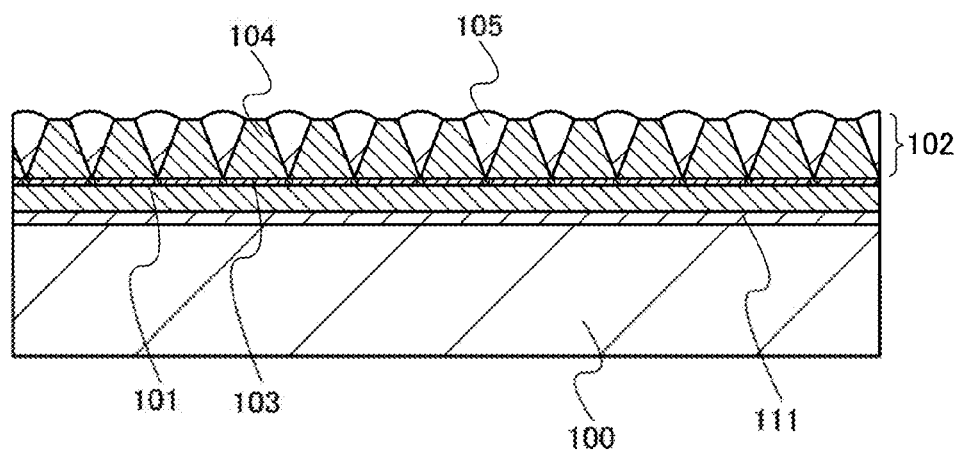

FIG. 5B illustrates a step in which the second semiconductor layer 102 is formed over the buffer layer 103. The second semiconductor layer 102 is formed so as to include a single crystal region 104 and an amorphous region 105 with the use of the single crystal region and the amorphous region of the buffer layer 103. That is, formation is performed so that the single crystal region 104 is grown from the single crystal region of the buffer layer 103 and the amorphous region 105 is grown from the amorphous region of the buffer layer 103.

The semiconductor film in which both of the single crystal region 104 and the amorphous region 105 exist is preferably formed b a chemical vapor deposition method. A chemical vapor deposition method is a method in which a thin film is formed by supplying a source gas and utilizing a chemical reaction in a gas phase and chemical reaction at a deposited surface (a surface reaction); radicals generated by decomposition of the source gas in a gas phase reaches a growing surface and the thin film is grown through the surface reaction.

The formation method with a radical reaction at a surface enables formation of a thin film depending on the crystallinity of a base. In other words, in the presence of the buffer layer 103 that is a base which includes the single crystal region and the amorphous region, the single crystal region 104 and the amorphous region 105 can be grown at the same time in the second semiconductor layer 102.

A plasma CVD method may be employed as a chemical vapor deposition method; alternatively, a reduced-pressure CVD method can be employed. By a plasma CVD method, the second semiconductor layer 102 can be formed at a substrate temperature of 350° C. or lower. By any of the above methods, the single crystal region 104 can be grown depending on the single crystal region existing in the base. In addition, the amorphous region 105 can be grown when the amorphous region exists in the base.

Here, when the growth rate of the single crystal region 104 is compared with that of the amorphous region 105, the growth rate of the amorphous region 105 is higher than that of the single crystal region 104. It can be considered that since the amorphous region 105 has a random structure and has a growing surface on which a large number of dangling bonds are exposed as compared with the single crystal region 104, a rate of attachment of radicals is increased, and therefore, the growth rate is increased. Thus, as illustrated in FIG. 5B, the growing surface of the amorphous region 105 bulges as compared with that of the single crystal region 104. Such a difference in the growth rate indicates that the proportion of the amorphous region 105 is increased as the thickness of the second semiconductor layer 102 is increased. The second semiconductor layer 102 is formed to a thickness of 500 nm to 1000 nm. With this thickness, the single crystal region 104 can be embedded in the amorphous region 105.

Figure 5C:
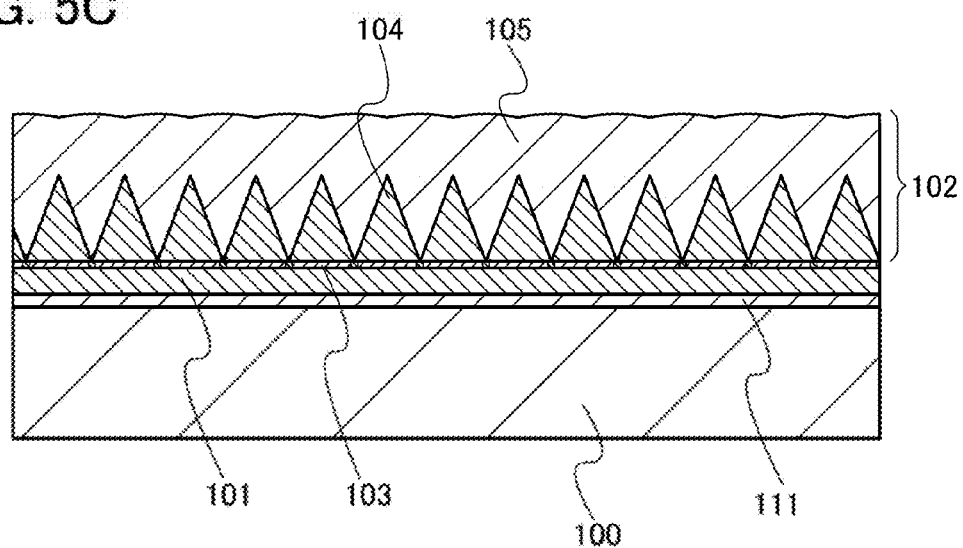

FIG. 5C illustrates a step after the growth of the second semiconductor layer 102. In this state, the single crystal region 104 is embedded in the amorphous region 105. As described above, this state is resulted from the difference in the growth rates between the amorphous region 105 and the single crystal region 104. That is, by utilizing the difference in the growth rates between the single crystal region 104 and the amorphous region 105, the single crystal region 104 can be embedded in the amorphous region 105.

Figure 6A:
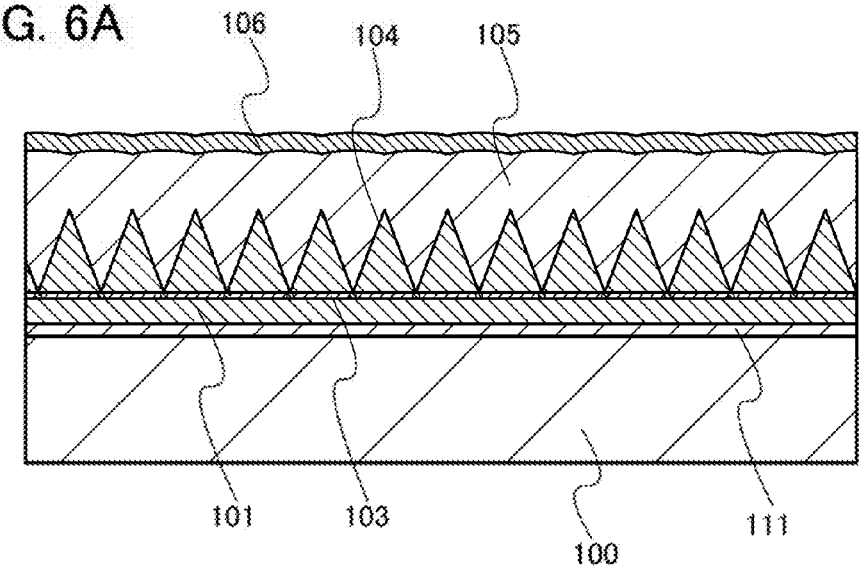
FIGS. 6A and 6B are cross-sectional views illustrating a manufacturing process of a photoelectric conversion device in Embodiment 2.

FIG. 6A illustrates a step in which a third semiconductor layer 106 is provided in contact with the second semiconductor layer 102. The third semiconductor layer 106 is formed by adding an impurity imparting a conductivity type opposite to that of the first semiconductor layer 101. In other words, when the first semiconductor layer 101 is p-type, the third semiconductor layer 106 is n-type; when the first semiconductor layer 101 is n-type, the third semiconductor layer 106 is p-type.

Note that the second semiconductor layer 102 is a semiconductor layer to which an impurity imparting a conductivity type is not added purposely. Alternatively, even when the second semiconductor layer 102 includes an impurity imparting a conductivity type purposely or unintentionally, the second semiconductor layer 102 includes the impurity at a lower concentration than those of the first semiconductor layer 101 and the third semiconductor layer 106.

In this manner, the first semiconductor layer 101, the second semiconductor layer 102, and the third semiconductor layer 106 are stacked, whereby a diode is formed.

Figure 6B:
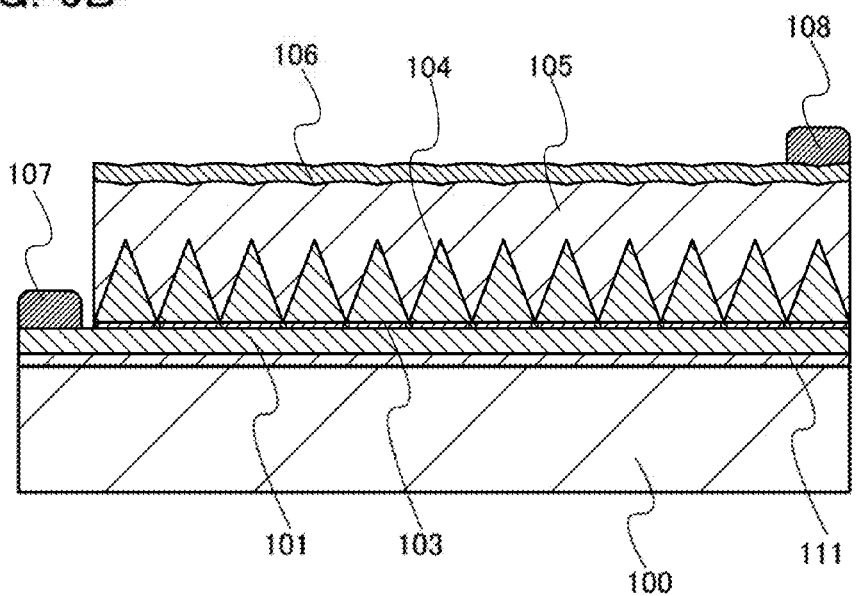

As illustrated in FIG. 6B, a first electrode 107 and a second electrode 108 may be provided over the first semiconductor layer 101 and the third semiconductor layer 106, respectively, as accessory components. The first electrode 107 and the second electrode 108 each are formed using a metal material such as aluminum, silver, lead, or a tin alloy.

According to the photoelectric conversion device of this embodiment, a photoelectric conversion device which allows the best use of a synergistic effect of a single crystal semiconductor and an amorphous semiconductor can be obtained without increase of the manufacturing steps.

EMBODIMENT 3

A method for manufacturing a photoelectric conversion device according to the present invention is described with reference to FIGS. 7A to 7C and FIG. 8. In this embodiment, a structure of a photoelectric conversion device different from that of Embodiment 2 is described.

Treatment in which a semiconductor substrate 109 is irradiated with ions to form a damaged region 110 is the same as that of FIG. 4A and therefore, description thereof is omitted.

Figure 7A:
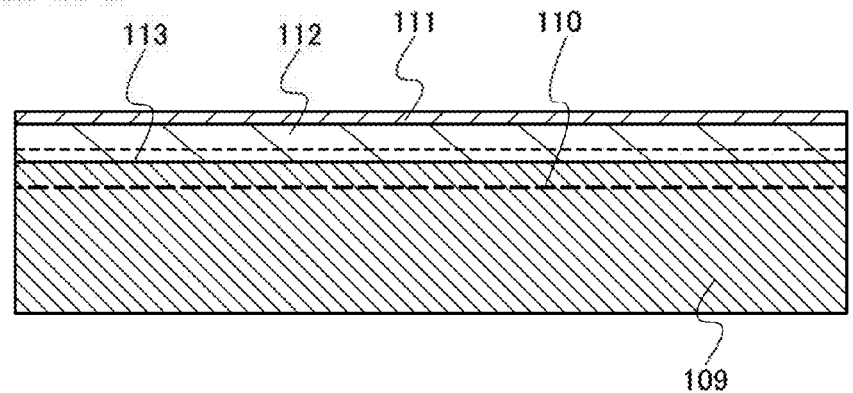
FIGS. 7A to 7C are cross-sectional views illustrating a manufacturing process of a photoelectric conversion device in Embodiment 3.

FIG. 7A illustrates a step in which a first electrode 112 is formed over the substrate 109. The first electrode 112 is formed using a metal material such as titanium (Ti), nickel (Ni), chromium (Cr), or aluminum (Al). The first electrode 112 is used as an electrode of a photoelectric conversion element. A first insulating layer 111 is formed over the first electrode 112. The first insulating layer 111 is preferably formed as a planarizing film using silicon oxide, aluminum oxide, or the like.

A barrier layer 113 which is formed using a silicide or a metal nitride is interposed between the first electrode 112 and the semiconductor substrate 109, which prevents the electrode material from being diffused to the semiconductor substrate 109 side. In addition, adhesion between the first electrode 112 and the semiconductor substrate 109 can be increased.

Figure 7B:
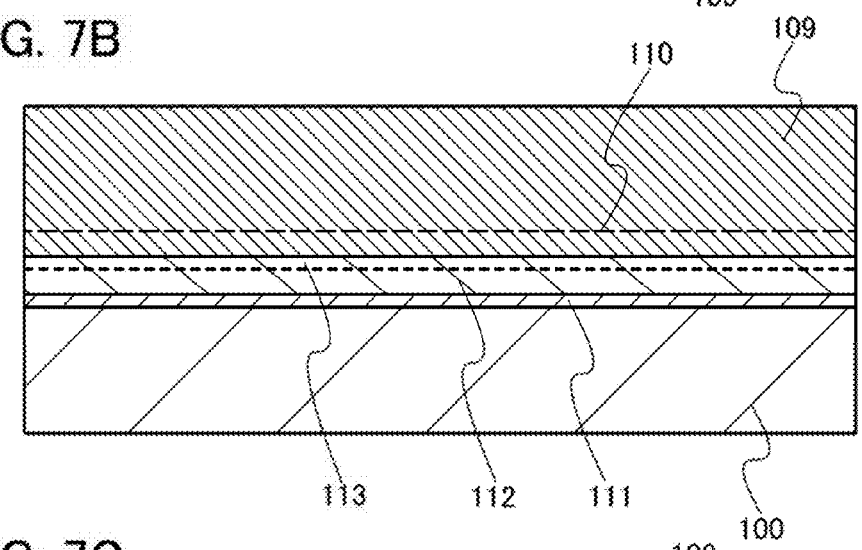

FIG. 7B illustrates a step in which a surface of the semiconductor substrate 109 over which the first electrode 112 is formed and a substrate 100 are banded together. A bonding technique is used for bonding the substrate 100 and the semiconductor substrate 109 together in a similar manner to Embodiment 2.

Figure 7C:
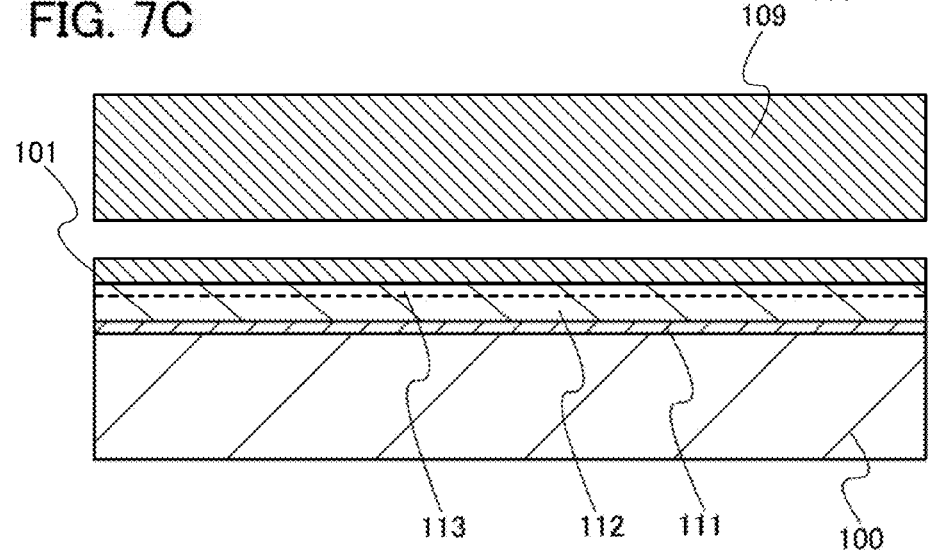

FIG. 7C Illustrates a step in which the semiconductor substrate 109 is separated at the damaged region 110 to provide the first electrode 112 and a first semiconductor layer 101 over the substrate 100. Heat treatment is performed at a temperature of 400° C. to 700° C. inclusive in a state where the first insulating layer 111, the first electrode 112, and the semiconductor substrate 109 are fixed over the substrate 100. With this heat treatment, microvoids formed in the damaged region 110 are expanded, so that crack is generated. Then, the semiconductor substrate 109 is separated and the first semiconductor layer 101 is left over the substrate 100.

This heat treatment is also effective for increasing a bonding strength between the substrate 100 and the first insulating layer 111. The bonding strength of the bonding by a hydrogen bond is weak; however, a hydroxy group is removed and then a covalent bond is formed by this heat treatment, whereby the bonding strength is increased.

The first semiconductor layer 101 is irradiated with ions in order to form the damaged layer, whereby crystal defects are formed in the first semiconductor layer 101 and part of the first semiconductor layer 101 is made amorphous. Therefore, treatment for repairing the crystal defects and the part of the first semiconductor layer which is made amorphous is performed. This treatment may be performed at 600° C. to 1100° C., alternatively, a method can be employed in which irradiation with a laser beam is performed to repair the crystal defects and recrystallize the region which has been made amorphous.

Figure 8:
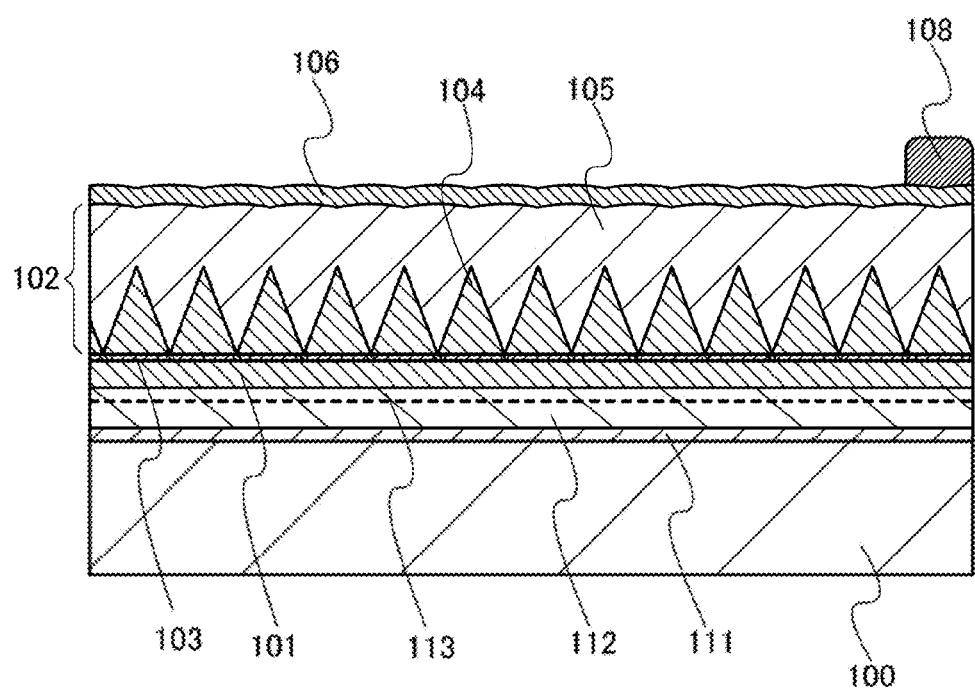
FIG. 8 is a cross-sectional view illustrating a manufacturing process of a photoelectric conversion device in Embodiment 3.

FIG. 8 is a step in which a second semiconductor layer 102 and a third semiconductor layer 106 are formed. The step is similar to that of Embodiment 2. A second electrode 108 may be formed to have a comb shape. Alternatively, a transparent electrode may be formed over the third semiconductor layer 106.

According the above method, a photoelectric conversion device including the second semiconductor layer 102 which has a photoelectric conversion effect, a single crystal region 104, and an amorphous region 105 can be manufactured, in a similar manner to Embodiment 2. According to the photoelectric conversion device of this embodiment, a photoelectric conversion device in which a combination of a single crystal semiconductor and an amorphous semiconductor generates a synergistic effect can be obtained without increase of the manufacturing steps.

EMBODIMENT 4

In this embodiment, an embodiment as an example of a stacked photoelectric conversion device is described. A stacked photoelectric conversion device includes, in its category, a photoelectric conversion device having a structure in which a plurality of photoelectric conversion units is stacked, for example, a tandem photoelectric conversion device.

The second semiconductor layer described in Embodiment 1 or 2 is a layer in which both of a crystal region and an amorphous region exist. The energy gap of the second semiconductor layer is broadened than that of a single crystal semiconductor because of including the amorphous region in addition to the single crystal region. This characteristic enables the photoelectric conversion cell described in Embodiment 1 or 2 to be used as a top cell located on the light incident side of a stacked photoelectric conversion device.

Figure 9:
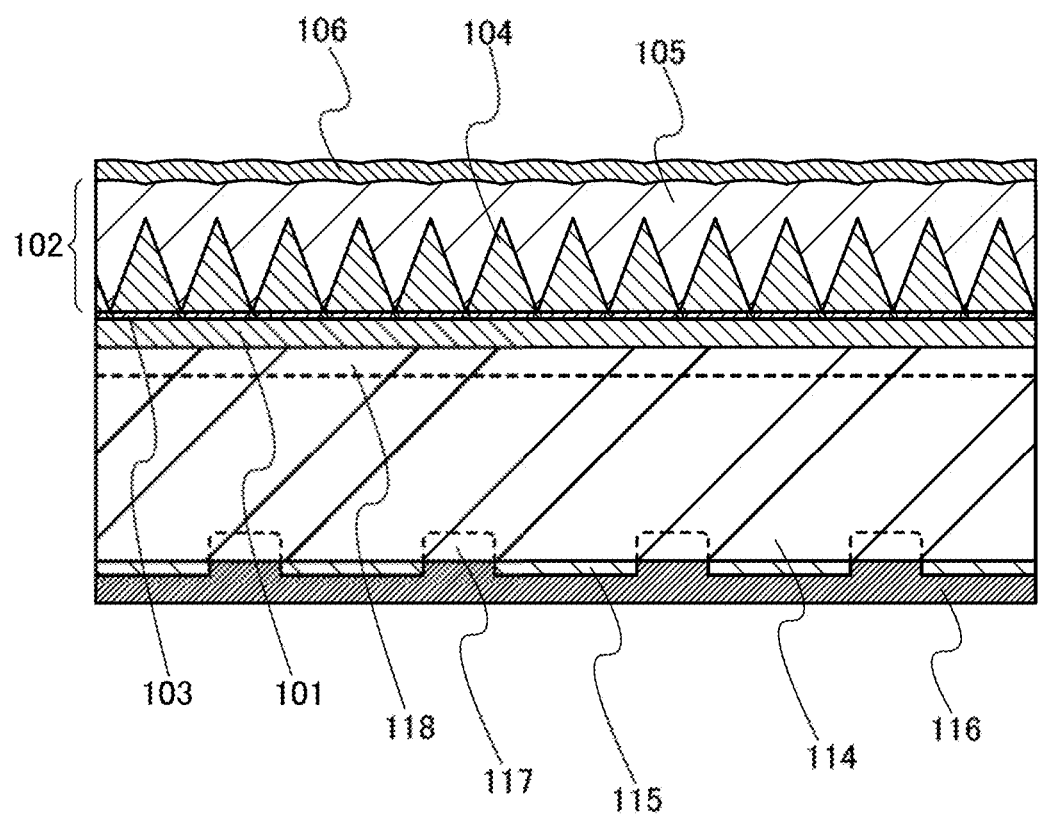
FIG. 9 is a cross-sectional view illustrating a structure of a tandem photoelectric conversion device in which a semiconductor substrate is used as a bottom cell in Embodiment 4.

FIG. 9 illustrates an example of a photoelectric conversion device in which a single crystal semiconductor is used as a bottom cell and a photoelectric conversion cell described in Embodiment 1 in which a first semiconductor layer 101, as second semiconductor layer 102, and a third semiconductor layer 106 are stacked is used as a top cell.

On the rear surface side of a semiconductor substrate 114 forming the bottom cell, a one-conductivity-type impurity region 117, a passivation layer 115, and a first electrode 116 in contact with the one-conductivity-type impurity region 117 are provided. In addition on a surface opposite to the surface over which the one-conductivity-type impurity region 117 is formed, an impurity region 118 having a conductivity type opposite to the one conductivity type is provided. In this manner, the one-conductivity-type impurity region 117 is provided over the one surface of the semiconductor substrate 114 and the impurity region 118 having a conductivity type opposite to the one conductivity type is provided over the other surface, thereby forming a photoelectric conversion unit.

As the first semiconductor layer 101, crystals of a single crystal semiconductor including an impurity imparting the one conductivity type are grown over the semiconductor substrate 114. The second semiconductor layer 102 formed thereover has the same structure as Embodiment 1 and is manufactured in a similar manner to Embodiment 2.

According to the photoelectric conversion device of this embodiment, when the second semiconductor layer 102 including a single crystal region 104 and an amorphous region 105 is provided in the top cell, a region in which photocarriers are generated and a region through which photocarriers are transported can be separated; therefore, reduction in the photocurrent of the top cell due to photodegradation and reduction in conversion efficiency caused by losing balance between the top cell and the bottom cell can be prevented.

EXAMPLE 1

In this example, an example of a method for manufacturing a semiconductor liner including a single crystal region and an amorphous region is described. In order to manufacture samples, n-type single crystal silicon wafers having resistivity of 3 Ωcm to 7 Ωcm which had been subjected to mirror polishing were used. As the single crystal semiconductor wafers, three kinds of single crystal silicon wafers which had plane directions of (100), (110), and (111) were used.

A second semiconductor layer was formed over a surface of each of the single crystal silicon wafers under conditions described in Table 1 by a plasma CVD method. In Table 1, conditions (1) are conditions for forming a buffer layer and conditions (2) conditions for forming a semiconductor layer themed over the buffer layer. The conditions (1) and the conditions (2) mainly differ in the dilution ratio of a hydrogen gas with respect to a silane gas and the power frequency for generating plasma. That is, in the conditions (1), the dilution ratio of a hydrogen gas with respect to a silane gas is a high ratio of 100:1 and the power frequency is 60 MHz in the VHF band; in the conditions (2), the dilution ratio of a hydrogen gas with respect to a silane gas is 6:1 and the power frequency is 27 MHz in the HF band. The conditions (1) refers to conductions under which a single crystal region is easily formed over a single crystal silicon wafer; the conditions (2) refers to conditions under which both of a single crystal region and an amorphous region can be formed.

Figure 10:
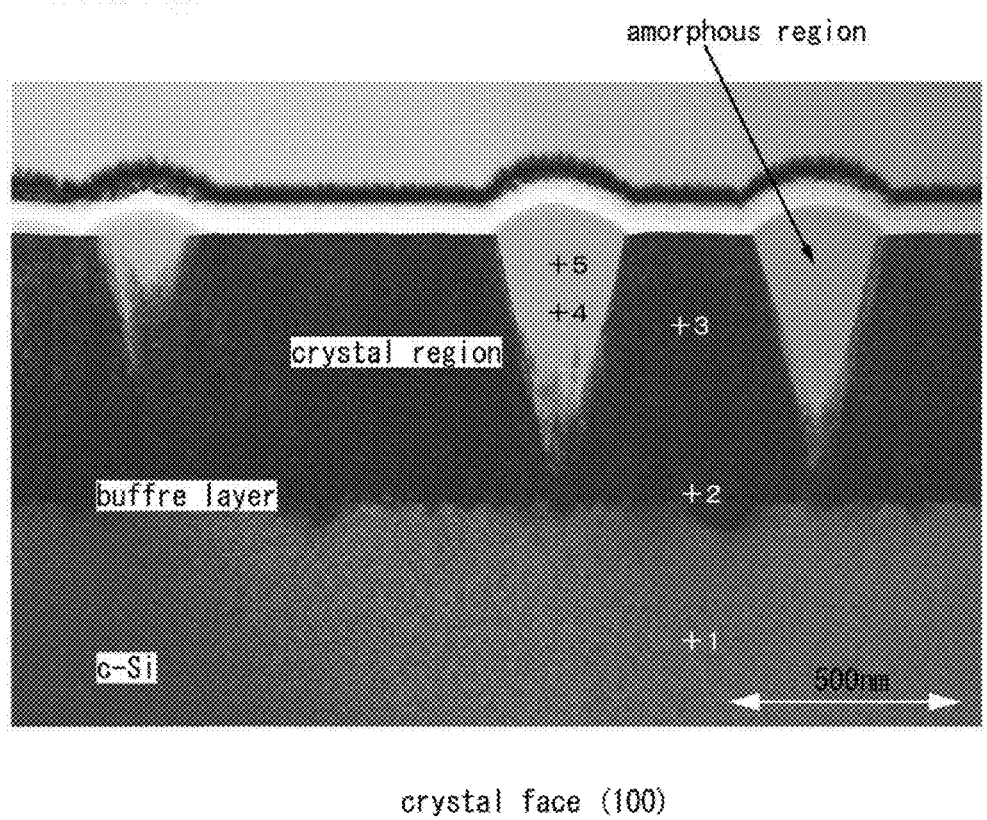
FIG. 10 is art electron micrograph showing a cross-sectional structure of a sample in which a semiconductor layer including a single crystal region and an amorphous region is formed over a single crystal silicon wafer having a plane direction of (100).
Figure 11A:
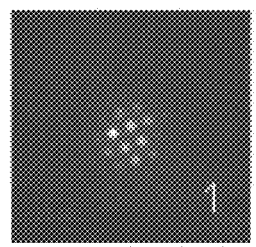
FIGS. 11A to 11E are electron diffraction images showing a crystal structure observed in FIG. 10.
Figure 11B:
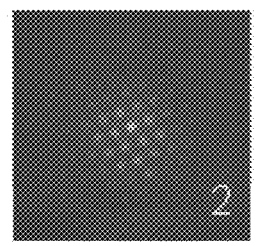
Figure 11C:
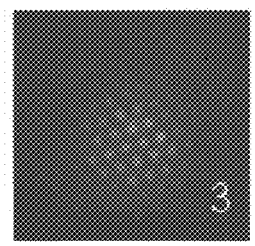
Figure 11D:
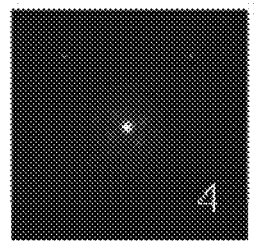
Figure 11E:
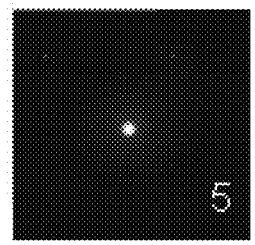
Figure 12A:
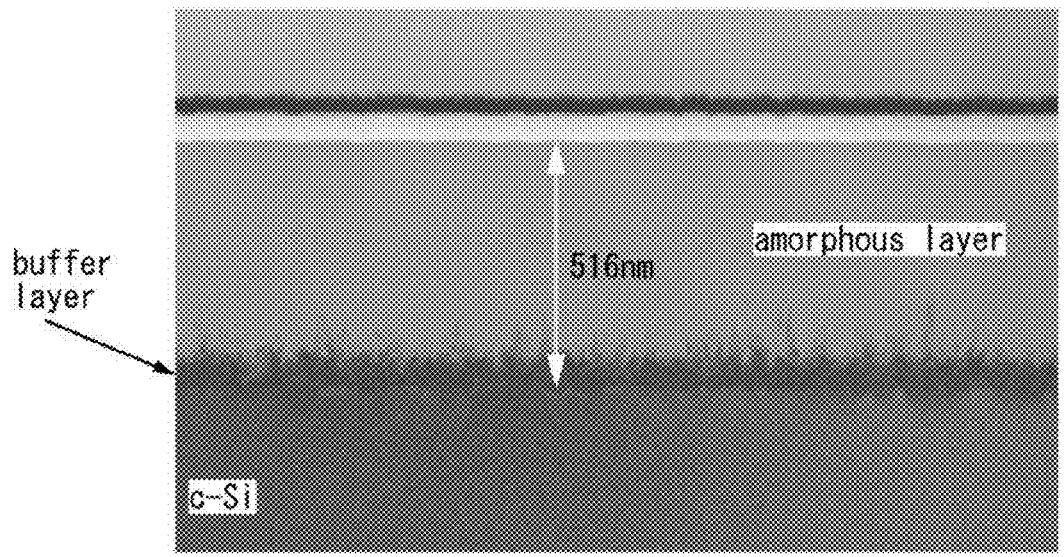
FIG. 12A is an electron micrograph showing a cross-sectional structure of a sample in which a semiconductor layer is formed over a single crystal silicon wafer having a plane direction of (110) in the same conditions as that of the sample of FIGS. 10 and 12B is an electron micrograph showing a cross-sectional structure of a sample in which a semiconductor layer is formed over a single crystal silicon wafer having is plane direction of (111) in the same conditions as that of the sample of FIG. 10.
Figure 12B:
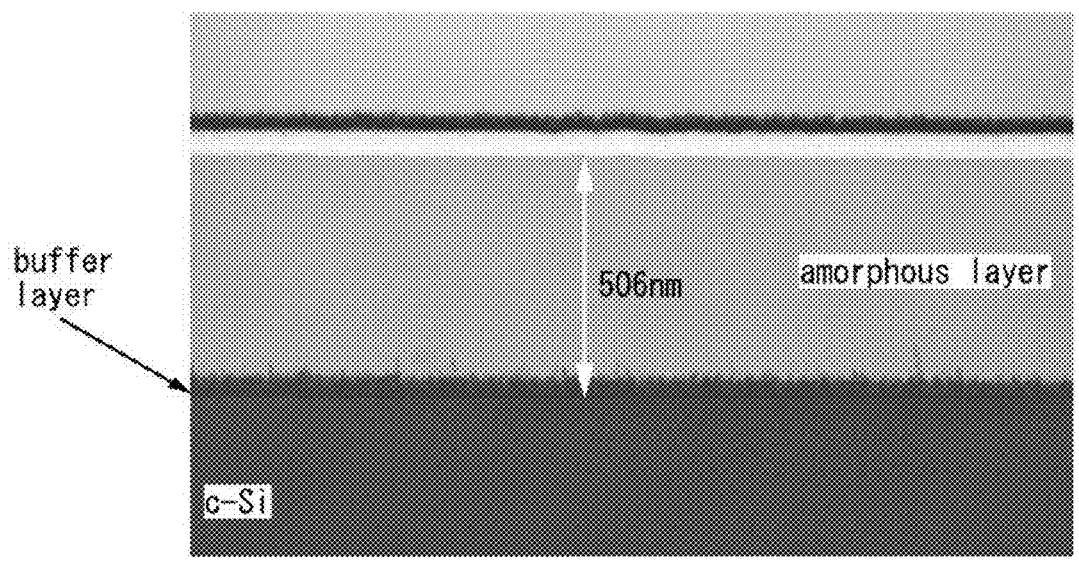

FIG. 12A is an electron micrograph showing a structure of a cross section of the sample manufactured using the single crystal silicon wafer having a plane direction of (110) plane under the conditions of Table 1 and FIG. 12B is an electron micrograph showing a structure of a cross section of the sample manufactured using the single crystal silicon wafer having a plane direction of (111) plane under the conditions of Table 1. In these electron micrographs, a region having a wedge shape observed in the semiconductor layer in FIG. 10 is not observed. Then, the semiconductor layer formed to a thickness of approximately 500 nm has an amorphous structure. The results show that the structure of the semiconductor layer formed over the single crystal silicon wafer with the buffer layer interposed therebetween is changed depending on the plane direction of the single crystal silicon wafer.

In this manner, the results of this example show that the semiconductor layer including the single crystal region and the amorphous region can be formed over the buffer layer formed over the single crystal silicon. It is ensured that the amorphous region is grown so as to have a conical and the proportion thereof in the semiconductor layer is increased in accordance with increase of the thickness of the semiconductor layer. In addition, in this example, it is shown that the

TABLE 1

| | $SiH_4$ FLOW RATE sccm | $H_2$ FLOW RATE | PRESSURE Pa | POWER FREQUENCY MHz | ELECTRIC POWER W | ELECTRODE DISTANCE mm | SUBSTRATE TEMPERATURE °C. | RATE OF LAYER FORMATION nm/min |
|---|---|---|---|---|---|---|---|---|
| CONDITION (1) | 4 | 400 | 100 | 60 | 15 | 20 | 280 | 3 |
| CONDITION (2) | 25 | 150 | 67 | 27 | 30 | 25 | 280 | 13~15 |

FIG. 10 is an electron micrograph showing a structure of a cross section of the sample manufactured using the singe crystal silicon wafer having a plane direction of (100) plane under the conditions of Table 1. In FIG. 10, a buffer layer was formed to a thickness of approximately 20 nm over the single crystal silicon wafer having a (100) plane and a region whose cross section appeared to have a wedge shape (have a conical shape in three dimensions) in the semiconductor layer formed over the buffer layer was observed. In order to clarify the structure of the semiconductor layer formed over the buffer layer, the crystallinity of each of measurement points 1 to 5 shown in FIG. 10 are measured by electron diffraction and results thereof are shown in FIG. 11.

In FIG. 11, electron diffraction images (A), (B), (C), (D), and (E) are shown, which correspond to the measurement point 1 (the single crystal silicon wafer), the measurement point 2 (the vicinity of the buffer layer), the measurement point 3 the semiconductor layer), the measurement point 4 (the region appearing to have a wedge shape in the semiconductor layer), and the measurement point 5 (the region appearing to have a wedge shape in the semiconductor layer), respectively. As a result, a diffraction pattern can be clearly observed in each of the measurement points 1 to 3, which shows that these regions include single crystals. On the other hand, a halo pattern is observed in each of the measurement points 4 and 5, which shows that the region appearing to have a wedge shape has an amorphous structure. As apparent from the electron micrographs in FIG. 10, the single crystal region and the amorphous region are separated distinctively.

single crystal silicon wafer having a (100) plane (equivalent to {100} plane) is used, whereby the semiconductor layer including the single crystal region and the amorphous region can be formed.

EXAMPLE 2

In this example, an example is described, in which a single crystal silicon layer is formed over a glass substrate and a semiconductor layer including a single crystal region and an amorphous region is formed thereover.

An n-type single crystal silicon water which had a (100) plane and resistivity of 3 Ωcm to 7 Ωcm and which had been subjected to mirror polishing was used. The single crystal silicon wafer was thermally oxidized by heating at 950° C. in an oxygen atmosphere including HCl at 3% and an oxide film with a thickness of 500 nm was formed thereover.

The single crystal silicon wafer over which the oxide film was formed was irradiated with hydrogen ions, so that a damaged layer was formed in the single crystal silicon wafer. The irradiation with hydrogen ions was performed at an accelerating voltage of 25 kV and dosage of $1.8 \times 10^{16}$ ions/cm.

Alter that, a silicon nitride oxide film was formed by a plasma CVD method so as to have a thickness of 50 nm over the single crystal silicon wafer over which the oxide film was formed. The silicon nitride oxide film W as formed under the following conditions: $SiH_4$, $N_2O$, $NH_3$, and $H_2$ were supplied to a reaction chamber of a plasma CVD apparatus at a predetermined flow rate; the pressure is 160 Pa and the substrate temperature is 300° C.

A surface over which the silicon nitride oxide film was formed was disposed to be in contact with the glass substrate and bonded thereto. Then, heat treatment is performed at 200° C. for 2 hours and 600° C. for 2 hours. Then the single crystal silicon wafer was removed and a single crystal silicon layer with a thickness of 50 nm wits left over the glass substrate.

In a state where the single crystal silicon layer was provided over the glass substrate, a buffer layer and a semiconductor layer were formed in conditions shown in Table 1. The semiconductor layer was formed to a thickness of 980 nm approximately.

Figure 13:
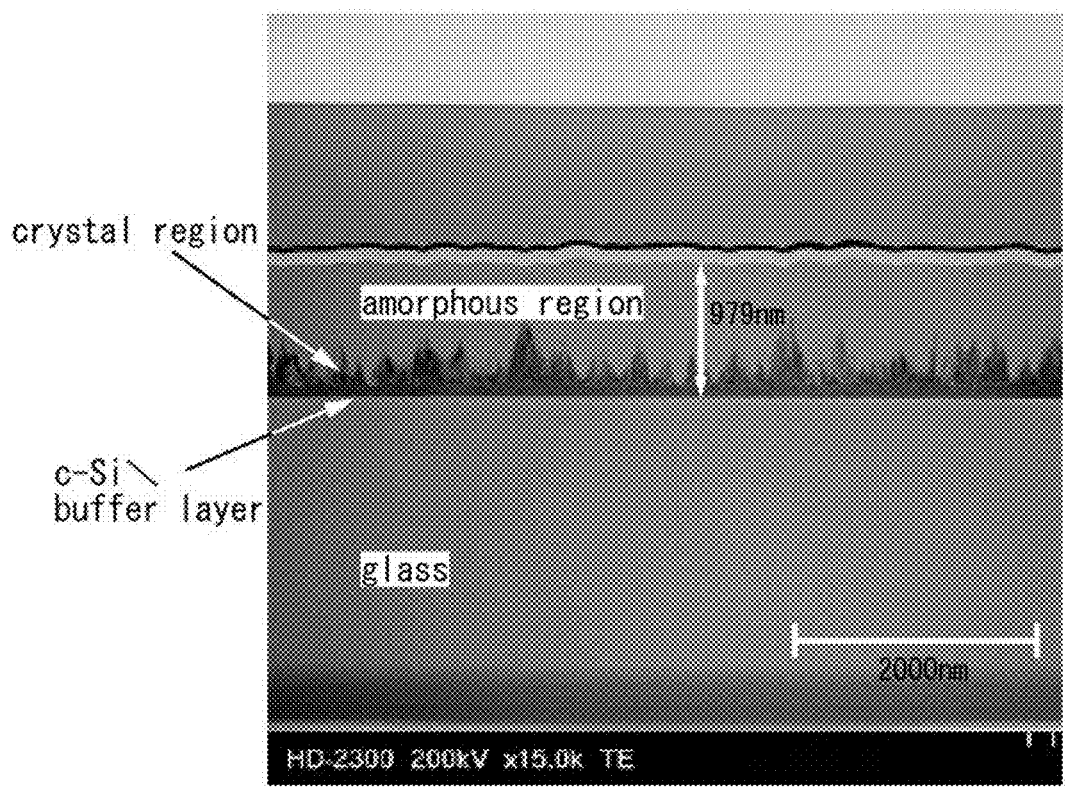
FIG. 13 is an electron micrograph at a magnification of 15000 times showing a cross-sectional structure of a sample obtained by providing a single crystal silicon layer over a glass substrate and forming a semiconductor layer including a single crystal region and an amorphous region thereover.
Figure 14:
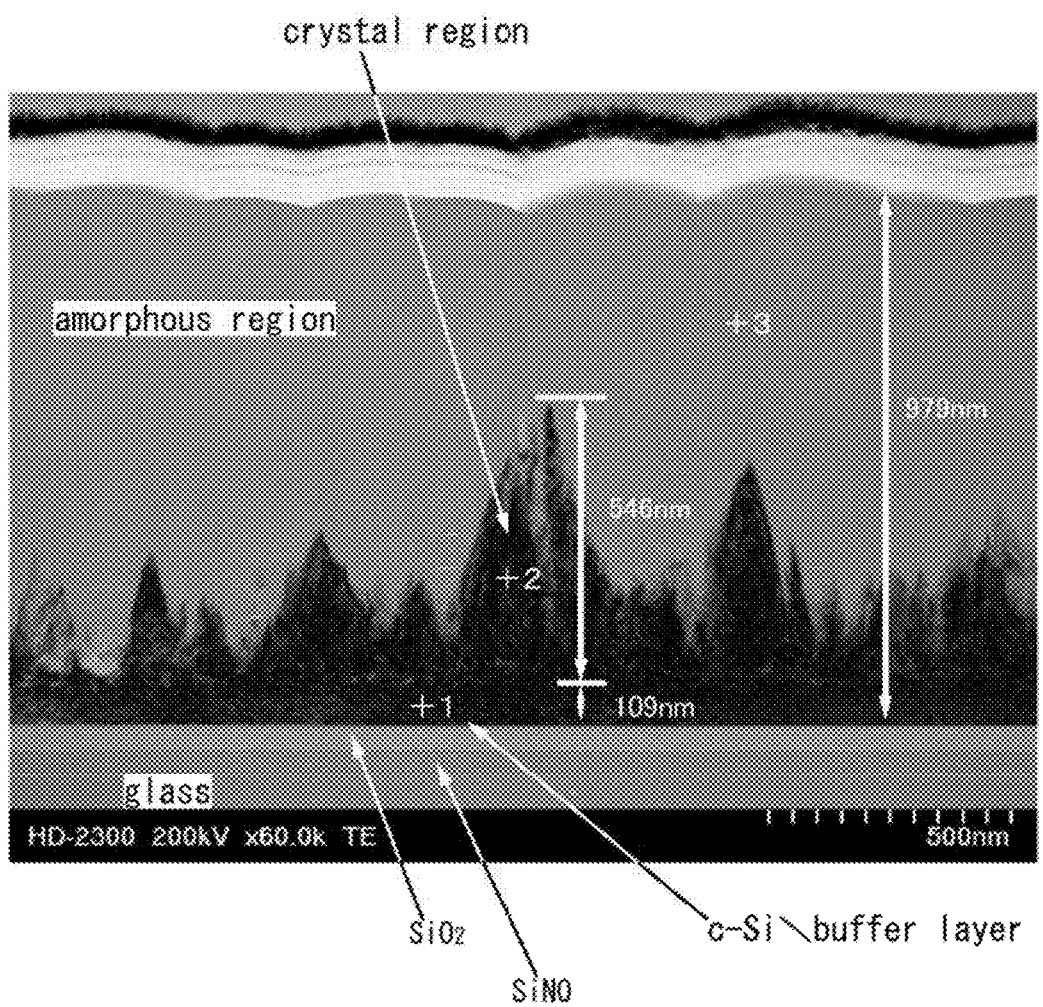
FIG. 14 is an electron micrograph showing a sample of FIG. 13 at a magnification of 60000 times.

FIG. 13 is an electron micrograph showing the cross-sectional structure of the sample manufactured in this manner. In the electron micrograph observed at a magnification of 15000 times, it can be observed that the semiconductor layer including a single crystal region and an amorphous region is formed over the glass substrate with the single crystal silicon layer and the butler layer interposed therebetween. FIG. 14 is electron micrograph which is observed at a magnification of 60000 times in order to investigate the structure of this semiconductor layer in detail. The silicon oxide film and the silicon nitride oxide film are clearly observed between the glass substrate and the single crystal silicon layer.

Figure 15A:
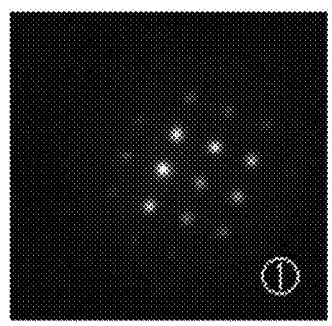
FIGS. 15A to 15C are electron diffraction images each showing a crystal structure of a sample observed in FIG. 14.
Figure 15B:
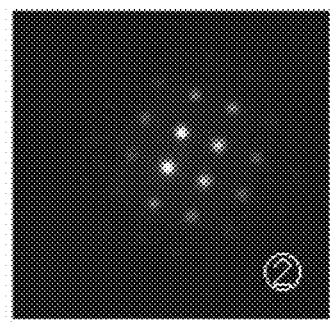
Figure 15C:
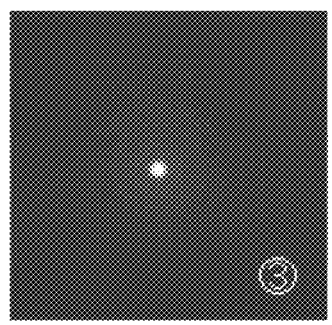

FIGS. 15A to 15C are results obtained by measuring the crystallinity of each of measurement points 1 to 3 in FIG. 14 by electron diffraction in order to clarify the structure of the semiconductor layer.

In FIGS. 15A to 15C, electron diffraction images (A) to (C) are shown, which correspond to the measurement point 1 (the single crystal silicon wafer), the measurement point 2 (a region on the bottom cell side in the semiconductor layer), and the measurement point 3 (a region on the top cell side in the semiconductor layer), respectively. As a result, a diffraction pattern can be clearly observed in each of the measurement points 1 and 2 which shows that these regions include single crystals. On the other hand, a halo pattern is observed in the measurement point 3, which shows that the region on the top cell side in the semiconductor layer has an amorphous structure.

In the electron micrograph of FIG. 14, it can be observed that the single crystal region in the semiconductor layer includes growing ends each having a needle-like shape and is grown to reach the region approximately 546 nm away from the buffer layer side. In the region more than 546 nm away from the buffer layer side, almost all part of the semiconductor layer is occupied by the amorphous region. Such a structure can be explained by a difference in the growth rate between the single crystal region and the amorphous region as described in FIGS. 2A and 2B. That is, it can be considered that since the growth rate of the amorphous region is higher than that of the single crystal region, the proportion of the amorphous region is gradually increased with respect to that of the single crystal region as the thickness of the semiconductor layer is increased although the semiconductor layer is dominantly occupied by the single crystal region at the beginning of formation of the semiconductor layer. Then, it shows that when the thickness of the semiconductor layer is approximately 550 nm or more, the single crystal region is embedded in the amorphous region.

In this manner, the results of this example show that the semiconductor layer including the single crystal region and the amorphous region can be formed also by bonding the single crystal silicon layer to the glass substrate and forming the buffer layer thereover. In addition, the results of this example show that the single crystal region is embedded in the amorphous region as the thickness of the semiconductor layer is increased.

This application is based on Japanese Patent Application serial no. 2008-243695 filed with Japan Patent Office on Sep. 24, 2008, the entire contents of which are hereby incorporated by reference.

What is claimed is:

1. A photoelectric conversion device comprising:
   a single crystal semiconductor layer having one conductivity type over a substrate;
   a buffer layer including a single crystal region and an amorphous region over the single crystal semiconductor layer;
   a first semiconductor layer including a single crystal region and an amorphous region over and in direct contact with the buffer layer; and
   a second semiconductor layer having a conductivity type opposite to the one conductivity type over the first semiconductor layer,
   wherein a proportion of the amorphous region in the first semiconductor layer gradually increases with respect to a proportion of the single crystal region in the first semiconductor layer as the distance from the buffer layer in the direction of the second semiconductor layer increases forming a conical shape, and
   wherein the first semiconductor layer has i-type conductivity.

2. The photoelectric conversion device according to claim 1, wherein the single crystal semiconductor layer comprises single crystal silicon.

3. The photoelectric conversion device according to claim 2, wherein a plane direction of the single crystal silicon is {100}.

4. A photoelectric conversion device comprising:
   a single crystal semiconductor layer having one conductivity type over a substrate;
   a buffer layer including a single crystal region and an amorphous region over the single crystal semiconductor layer;
   a first semiconductor layer including a single crystal region and an amorphous region over and in direct contact with the buffer layer; and
   a second semiconductor layer having a conductivity type opposite to the one conductivity type over the first semiconductor layer,
   wherein the single crystal region in the first semiconductor layer is in contact with the buffer layer and has a sharp-pointed growing end on the second semiconductor layer side,
   wherein a proportion of the amorphous region in the first semiconductor layer gradually increases with respect to a proportion of the single crystal region in the first semiconductor layer as the distance from the buffer layer in the direction of the second semiconductor layer increases, and
   wherein the first semiconductor layer has i-type conductivity.

5. The photoelectric conversion device according to claim 4, wherein the single crystal semiconductor layer comprises single crystal silicon.

6. The photoelectric conversion device according to claim 5, wherein a plane direction of the single crystal silicon is {100}.

7. A photoelectric conversion device comprising:
a first semiconductor layer having one conductivity type;
a second semiconductor layer including a single crystal region and an amorphous region over the first semiconductor layer;
a third semiconductor layer including a single crystal region and an amorphous region over and in direct contact with the second semiconductor layer; and
a fourth semiconductor layer having a conductivity type opposite to the one conductivity type over the third semiconductor layer,
wherein a proportion of the amorphous region in the third semiconductor layer gradually increases with respect to a proportion of the single crystal region in the third semiconductor layer as the distance from the second semiconductor layer in the direction of the fourth semiconductor layer increases forming a conical shape, and
wherein the third semiconductor layer has i-type conductivity.

8. The photoelectric conversion device according to claim 7, wherein the first semiconductor layer comprises single crystal silicon.

9. The photoelectric conversion device according to claim 8, wherein a plane direction of the single crystal silicon is {100}.

* * * * *

UNITED STATES PATENT AND TRADEMARK OFFICE
CERTIFICATE OF CORRECTION

PATENT NO. : 9,450,132 B2
APPLICATION NO. : 14/514552
DATED : September 20, 2016
INVENTOR(S) : Sho Kato et al.

Page 1 of 2

It is certified that error appears in the above-identified patent and that said Letters Patent is hereby corrected as shown below:

On the Title Page

Item (57) Abstract, replace "butler" with --buffer--;

In the Specification

Column 2, Line 3, replace "farce" with --large--;

Column 2, Line 36, replace "aver" with --over--;

Column 2, Line 52, after "effect" replace ", in" with --. In--;

Column 3, Line 10, replace "butler" with --buffer--;

Column 3, Line 29, replace "OR" with --on--;

Column 4, Line 39, replace "art" with --an--;

Column 4, Line 53, replace "is" with --a--;

Column 6, Line 25, after "lowering" delete ",";

Column 6, Line 67, replace "as" with --a--;

Column 8, Line 60, replace "butler" with --buffer--;

Column 8, Line 60, after "flat" insert --,--;

Column 9, Line 39, after "having" delete ",";

Signed and Sealed this
Eleventh Day of April, 2017

Michelle K. Lee
*Director of the United States Patent and Trademark Office*

Column 10, Line 16, after "formed" replace "b" with --by--;

Column 11, Line 11, after "preferably" replace "is" with --a--;

Column 11, Line 42, after "formed" replace "b" with --by--;

Column 13, Line 23, replace "banded" with --bonded--;

Column 13, Line 27, replace "Illustrates" with --illustrates--;

Column 14, Line 29, replace "as" with --a--;

Column 14, Line 65, replace "liner" with --layer--;

Column 15, Line 10, after "(2)" insert --are--;

Column 15, Line 11, replace "themed" with --formed--;

Column 15, Line 38, replace "singe" with --single--;

Column 15, Line 54, after "3" replace "the" with --(the--;

Column 16, Line 48, replace "water" with --wafer--;

Column 16, Line 59, replace "ions/cm." with --ions/$cm^2$.--;

Column 16, Line 60, replace "Alter" with --After--;

Column 16, Line 63, replace "W as" with --was--;

Column 17, Line 6, replace "wits" with --was--;

Column 17, Line 19, replace "butler" with --buffer--;

Column 17, Line 60, after "2" insert --,--; and

In the Claims

Column 19, Line 17, in Claim 7, delete "forming a conical shape".